(12) United States Patent
Kimoto et al.

(10) Patent No.: US 9,869,917 B2
(45) Date of Patent: Jan. 16, 2018

(54) ACTIVE MATRIX SUBSTRATE AND METHOD FOR MANUFACTURING THE SAME

(71) Applicant: Sharp Kabushiki Kaisha, Sakai, Osaka (JP)

(72) Inventors: Hidenobu Kimoto, Sakai (JP); Tetsuya Tarui, Sakai (JP); Yoshihiro Seguchi, Sakai (JP); Takehisa Sugimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/323,440

(22) PCT Filed: Jun. 24, 2015

(86) PCT No.: PCT/JP2015/068178
§ 371 (c)(1),
(2) Date: Jan. 3, 2017

(87) PCT Pub. No.: WO2016/021320
PCT Pub. Date: Feb. 11, 2016

(65) Prior Publication Data
US 2017/0139298 A1 May 18, 2017

(30) Foreign Application Priority Data
Aug. 7, 2014 (JP) .................................. 2014-161943

(51) Int. Cl.
*G02F 1/1362* (2006.01)
*G02F 1/1368* (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
CPC ...... G02F 1/1362–1/136213; G02F 1/136227; G02F 1/136277; G02F 1/136286;
(Continued)

(56) References Cited

U.S. PATENT DOCUMENTS 6,646,707 B2 * 11/2003 Noh .................. G02F 1/134363
349/141
8,330,883 B2 * 12/2012 Tsubata ................. G02F 1/1345
349/138
(Continued)

FOREIGN PATENT DOCUMENTS

JP 2010-191410 A 9/2010

*Primary Examiner* — Maliheh Malek
(74) *Attorney, Agent, or Firm* — Keating & Bennett, LLP

(57) ABSTRACT

An active matrix substrate in a liquid crystal panel of an FFS mode has a data line 24 including an amorphous Si film 122, an n+amorphous Si film 123, a main conductor part 133, and an IZO film 141. The main conductor part 133 and the IZO film 141 are etched at a portion close to the end of a covered region of a photoresist 142, to form the n+amorphous Si film 123 larger than the main conductor part 133 and the IZO film 141. A pattern of a photomask for a source layer is made larger than a pattern of a photomask for a pixel electrode layer, to form the amorphous Si film 122 larger than the n+amorphous Si film 123. The main conductor part 133 is formed of a molybdenum-based material, and in a layer over the data line 24, two-layered protective insulating films are formed such that a compressive stress is generated in one film and a tensile stress is generated in the other film. Accordingly, a high-yield active matrix substrate having a common electrode is provided.

16 Claims, 9 Drawing Sheets

(51) Int. Cl.
*G02F 1/1343* (2006.01)
*H01L 21/28* (2006.01)
*H01L 29/786* (2006.01)
*G02F 1/1333* (2006.01)
*H01L 27/12* (2006.01)
*G02F 1/133* (2006.01)
*G02F 1/1345* (2006.01)

(52) U.S. Cl.
CPC .. *G02F 1/133345* (2013.01); *G02F 1/134309* (2013.01); *H01L 21/28* (2013.01); *H01L 27/124* (2013.01); *H01L 27/1288* (2013.01); *H01L 29/786* (2013.01); *G02F 1/13454* (2013.01); *G02F 2001/13629* (2013.01); *G02F 2001/134372* (2013.01); *G02F 2001/136295* (2013.01); *G02F 2201/121* (2013.01); *G02F 2201/123* (2013.01); *G02F 2201/40* (2013.01); *G02F 2202/10* (2013.01); *G02F 2202/103* (2013.01)

(58) Field of Classification Search
CPC ..... G02F 1/13629; G02F 2001/136231; G02F 2001/13625; G02F 2001/136281; G02F 1/1368; G02F 1/13; G02F 1/1333; G02F 1/133302; G02F 1/133308; G02F 1/133345; G02F 1/1345–1/13458; H01L 27/3244–27/3248
See application file for complete search history.

(56) References Cited

U.S. PATENT DOCUMENTS

| | | | |
|---|---|---|---|
| 9,035,302 B2 * | 5/2015 | Misaki | H01L 21/0217 257/43 |
| 9,595,545 B2 * | 3/2017 | Misaki | H01L 27/1225 |
| 9,766,520 B2 * | 9/2017 | Feng | G02F 1/136204 |
| 2004/0066637 A1 * | 4/2004 | Imai | G02F 1/136204 361/777 |
| 2005/0179849 A1 * | 8/2005 | Nomura | G02F 1/1345 349/149 |
| 2008/0251787 A1 * | 10/2008 | Kim | H01L 22/32 257/48 |
| 2010/0187532 A1 | 7/2010 | Nagano et al. | |
| 2011/0050551 A1 * | 3/2011 | Ota | G02F 1/134363 345/87 |
| 2011/0057918 A1 * | 3/2011 | Kimura | G09G 3/3648 345/211 |
| 2011/0063199 A1 * | 3/2011 | Yamashita | G02F 1/1345 345/87 |
| 2011/0069090 A1 * | 3/2011 | Lee | G02F 1/134363 345/690 |
| 2014/0211120 A1 * | 7/2014 | Yang | G02F 1/136286 349/46 |
| 2015/0129877 A1 * | 5/2015 | Cho | G02F 1/134363 257/59 |
| 2015/0187948 A1 * | 7/2015 | Misaki | H01L 29/41733 257/43 |
| 2015/0287378 A1 * | 10/2015 | Jeong | G09G 3/3688 345/694 |
| 2015/0287799 A1 * | 10/2015 | Murashige | H01L 29/45 349/46 |
| 2015/0293546 A1 * | 10/2015 | Tanaka | G02F 1/1368 327/541 |
| 2015/0295092 A1 * | 10/2015 | Misaki | G02F 1/1368 257/43 |
| 2015/0301420 A1 * | 10/2015 | Yoshida | G02F 1/1345 257/43 |
| 2016/0209686 A1 * | 7/2016 | Imai | G02F 1/1337 |
| 2016/0291366 A1 * | 10/2016 | Hara | G02F 1/1345 |
| 2017/0139260 A1 * | 5/2017 | Kimoto | G02F 1/133345 |
| 2017/0139296 A1 * | 5/2017 | Kimoto | G02F 1/136259 |
| 2017/0146838 A1 * | 5/2017 | Nakata | G02F 1/1368 |
| 2017/0153752 A1 * | 6/2017 | Kurasawa | G06F 3/0416 |
| 2017/0219899 A1 * | 8/2017 | Furukawa | G02F 1/136286 |
| 2017/0227799 A1 * | 8/2017 | Kawamura | G02F 1/1337 |
| 2017/0261829 A1 * | 9/2017 | Song | G02F 1/136227 |

* cited by examiner

Fig. 6
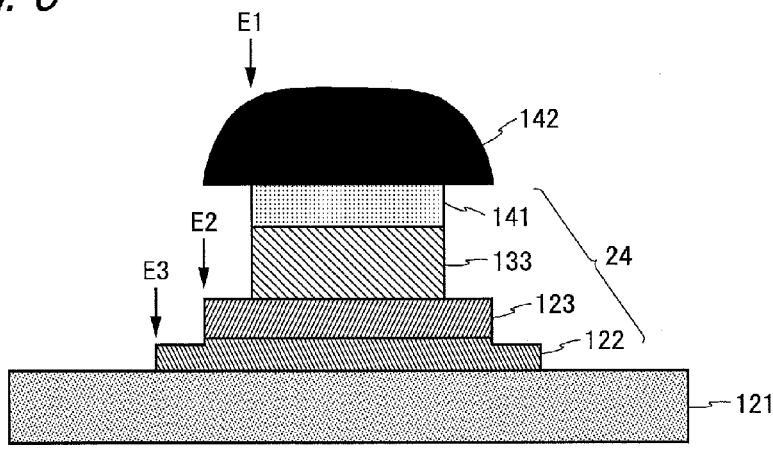
Fig. 7
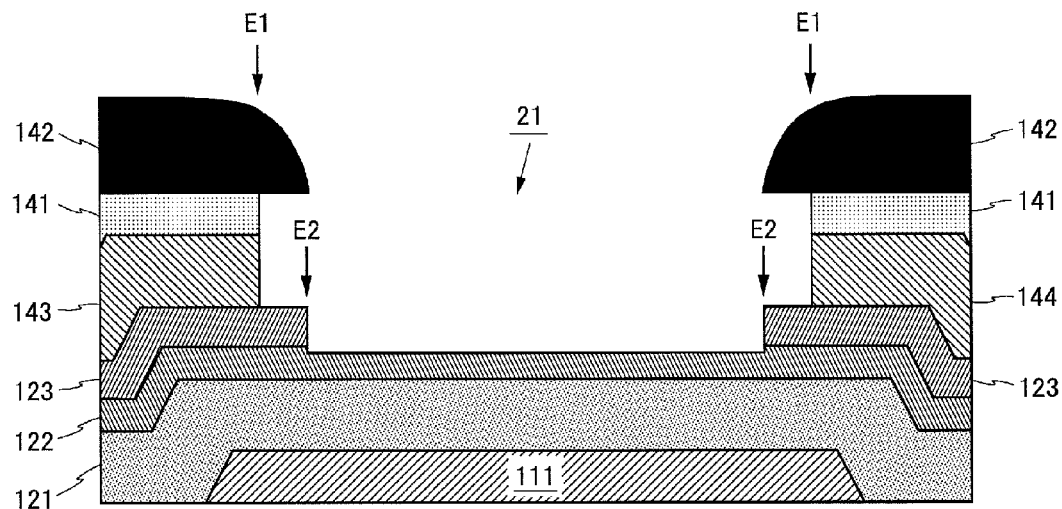
Fig. 8
| | LOWER LAYER SiNx FILM | UPPER LAYER SiNx FILM |
|---|---|---|
| FILM FORMATION TEMPERATURE | 270±10°C | 210±10°C |
| STEP COVERAGE | POOR | GOOD |
| FILM STRESS (FILM THICKNESS 500 nm) | COMPRESSIVE STRESS 380 MPa | TENSILE STRESS 160 MPa |
| FILM DENSITY | HIGH | LOW |

ACTIVE MATRIX SUBSTRATE AND METHOD FOR MANUFACTURING THE SAME

TECHNICAL FIELD

The present invention relates to a display device, and particularly relates to an active matrix substrate having a common electrode, and a method for manufacturing the same.

BACKGROUND ART

A liquid crystal display device has been widely used as a thin, light-weight, and low power consumption display device. A liquid crystal panel included in the liquid crystal display device has a structure formed by attaching an active matrix substrate and a counter substrate together, and providing a liquid crystal layer between the two substrates. A plurality of gate lines, a plurality of data lines, and a plurality of pixel circuits each including a thin film transistor (hereinafter referred to as TFT) and a pixel electrode are formed on the active matrix substrate.

As a system for applying an electric field to the liquid crystal layer of the liquid crystal panel, a vertical electric field system and a lateral electric field system are known. In a liquid crystal panel of the vertical electric field system, an almost vertical electric field is applied to the liquid crystal layer by using the pixel electrode and a common electrode formed on the counter substrate. In a liquid crystal panel of the lateral electric field system, the common electrode is formed on the active matrix substrate together with the pixel electrode, and an almost lateral electric field is applied to the liquid crystal layer by using the pixel electrode and the common electrode. The liquid crystal panel of the lateral electric field system is advantageous in having a wider view angle than the liquid crystal panel of the vertical electric field system.

As the lateral electric field system, an IPS (in-plane switching) mode and an FFS (fringe field switching) mode are known. In a liquid crystal panel of the IPS mode, the pixel electrode and the common electrode are each formed in the shape of comb teeth, and are disposed so as not to overlap each other in a plan view. In a liquid crystal panel of the FFS mode, a slit is formed either in the common electrode or the pixel electrode, and the pixel electrode and the common electrode are disposed so as to overlap each other via a protective insulating film in a plan view. The liquid crystal panel of the FFS mode is advantageous in having a higher aperture ratio than the liquid crystal panel of the IPS mode.

An active matrix substrate in the liquid crystal panel of the FFS mode is manufactured using five or six photomasks. Patent Document 1 describes a method for manufacturing the active matrix substrate using five photomasks. In the manufacturing method described in Patent Document 1, a photomask for a semiconductor layer is not used, a semiconductor layer is patterned using a photomask for a source layer, and a channel region of a TFT is formed using a photomask for a pixel electrode layer. In the active matrix substrate described in Patent Document 1, a data line is a laminated wiring formed in the semiconductor layer, an ohmic contact layer, the source layer, and the pixel electrode layer. Portions of the data line which are formed in the semiconductor layer, the ohmic contact layer, and the source layer have the same shape, and a portion of the data line which is formed in the pixel electrode layer is formed so as to cover the portions formed in the three layers.

PRIOR ART DOCUMENT

Patent Document

[Patent Document 1] Japanese Laid-Open Patent Publication No. 2010-191410

SUMMARY OF THE INVENTION

Problems to be Solved by the Invention

In the active matrix substrate in the liquid crystal panel of the FFS mode, the pixel electrode and the common electrode face each other with the protective insulating film interposed therebetween. In order to suppress display failure such as shadowing and flicker, a capacitance (storage capacitance) between the pixel electrode and the common electrode provided in each pixel is preferably made large. For making the storage capacitance large, the protective insulating film to be an interlayer film between the pixel electrode and the common electrode is preferably thin. However, when the protective insulating film is made thin, a particle or a generated foreign material may break through the protective insulating film. This causes the occurrence of a point defect due to a leakage between the pixel electrode and the common electrode or a linear defect due to a leakage between the data line and the common electrode, leading to deterioration in yield of the active matrix substrate, which is problematic.

Accordingly, an object of the present invention is to provide a high-yield active matrix substrate having a common electrode.

Means for Solving the Problems

According to a first aspect of the present invention, there is provided an active matrix substrate, including: a plurality of gate lines formed in a first wiring layer; a plurality of data lines, each of which is a laminated wiring formed in a first semiconductor layer, a second semiconductor layer, a second wiring layer, and a pixel electrode layer; a plurality of pixel circuits arranged corresponding to intersections of the gate lines and the data lines and each including a switching element and a pixel electrode; a protective insulating film formed in a layer over the gate line, the data line, the switching element, and the pixel electrode; and a common electrode formed in a layer over the protective insulating film, wherein the switching element includes a gate electrode formed in the first wiring layer, a source electrode and a drain electrode formed in the second wiring layer, a channel region formed in the first semiconductor layer, a semiconductor part formed in the second semiconductor layer and under the source electrode and the drain electrode, and a conductor part formed in the pixel electrode layer and on the source electrode and the drain electrode, and a portion of the data line which is formed in the second semiconductor layer is formed larger than portions of the data line which are formed in the second wiring layer and the pixel electrode layer, and the semiconductor part is formed larger than the source electrode, the drain electrode, and the conductor part.

According to a second aspect of the present invention, in the first aspect of the present invention, a portion of the data line which is formed in the first semiconductor layer is formed larger than the portion of the data line which is formed in the second semiconductor layer.

According to a third aspect of the present invention, in the first aspect of the present invention, the protective insulating film includes a lower layer insulating film and an upper layer insulating film which are formed by using an identical material under different conditions.

According to a fourth aspect of the present invention, in the third aspect of the present invention, a compressive stress is generated in one of the lower layer insulating film and the upper layer insulating film, and a tensile stress is generated in the other.

According to a fifth aspect of the present invention, in the third aspect of the present invention, a thickness of the lower layer insulating film is 150 to 350 nm, and a thickness of the upper layer insulating film is 400 to 600 nm.

According to a sixth aspect of the present invention, in the first aspect of the present invention, the portion of the data line which is formed in the second wiring layer, the source electrode, and the drain electrode are formed of molybdenum or a material containing molybdenum.

According to a seventh aspect of the present invention, in the sixth aspect of the present invention, the portion of the data line which is formed in the second wiring layer, the source electrode, and the drain electrode are formed of an alloy of molybdenum and niobium.

According to an eighth aspect of the present invention, there is provided a method for manufacturing an active matrix substrate, including: a step of forming a plurality of gate lines and gate electrodes of a plurality of switching elements in a first wiring layer; a step of forming a gate insulating film, forming a first semiconductor film in a first semiconductor layer, and forming a second semiconductor film in a second semiconductor layer; a source layer formation step of forming, in a second wiring layer, a first conductor part to be a base of a main conductor part of a plurality of data lines, and a second conductor part to be a base of a source electrode and a drain electrode of the switching element, while patterning the first and second semiconductor films to form a second semiconductor part to be a base of a first semiconductor part located under the main conductor part, a channel region of the switching element which is located in the first semiconductor layer, and a third semiconductor part to be abase of a semiconductor part located under the source electrode and the drain electrode in the second semiconductor layer; a pixel electrode layer formation step of forming, in a pixel electrode layer, a pixel electrode, a third conductor part located on the main conductor part, and a conductor part located on the source electrode and the drain electrode, while patterning the first and second conductor parts, a portion of the second semiconductor part which is formed in the second semiconductor layer, and the third semiconductor part, to form the main conductor part, the source electrode, the drain electrode, the first semiconductor part, and the semiconductor part; a step of forming a protective insulating film in a layer over the pixel electrode, and a step of forming a common electrode in a layer over the protective insulating film, wherein in the pixel electrode layer formation step, a portion of the first semiconductor part which is formed in the second semiconductor layer is formed larger than the main conductor part and the third conductor part, and the semiconductor part is formed larger than the source electrode, the drain electrode, and the conductor part.

According to a ninth aspect of the present invention, in the eighth aspect of the present invention, in the source layer formation step, a portion of the first semiconductor part which is formed in the first semiconductor layer is formed larger than the portion of the first semiconductor part which is formed in the second semiconductor layer.

According to a tenth aspect of the present invention, in the eighth aspect of the present invention, the pixel electrode layer formation step includes film formation processing, photoresist formation processing, etching processing, and photoresist peeling processing, and in the etching processing, using a photoresist formed in the photoresist formation processing as a mask, wet etching is performed on a film obtained in the film formation processing, and the first and second conductor parts, and dry etching is performed on the portion of the second semiconductor part which is formed in the second semiconductor layer, and the third semiconductor part.

According to an eleventh aspect of the present invention, in the ninth aspect of the present invention, a pattern for forming the second semiconductor part which is included in a photomask used in the source layer formation step is larger than a pattern for forming the main conductor part which is included in a photomask used in the pixel electrode layer formation step.

According to a twelfth aspect of the present invention, in the eighth aspect of the present invention, the step of forming the protective insulating film includes processing of forming a lower layer insulating film and an upper layer insulating film by using an identical material under different conditions.

According to a thirteenth aspect of the present invention, in the twelfth aspect of the present invention, in the processing of forming the lower layer insulating film and the upper layer insulating film, the lower layer insulating film and the upper layer insulating film are formed such that a compressive stress is generated in one film and a tensile stress is generated in the other film.

According to a fourteenth aspect of the present invention, in the twelfth aspect of the present invention, in the processing of forming the lower layer insulating film and the upper layer insulating film, a lower layer insulating film with a thickness of 150 to 350 nm and an upper layer insulating film with a thickness of 400 to 600 nm are formed.

According to a fifteenth aspect of the present invention, in the eighth aspect of the present invention, in the source layer formation step, the first and second conductor parts are formed of molybdenum or a material containing molybdenum.

According to a sixteenth aspect of the present invention, in the fifteenth aspect of the present invention, in the source layer formation step, the first and second conductor parts are formed of an alloy of molybdenum and niobium.

Effects of the Invention

According to the first or eighth aspect of the present invention, the portion formed in the lower layer (second semiconductor layer) is formed larger than the portion formed in the upper layer (second wiring layer and pixel electrode layer), and hence, the cross sectional shape of the data line, and the source electrode and the drain electrode of the switching element are formed in a stepwise manner. It is thus possible to achieve high coverage properties of the protective insulating film formed on the data line and the switching element, and high yield of the active matrix substrate having the common electrode.

According to the second or ninth aspect of the present invention, the portion of the data line which is formed in the first semiconductor layer is formed larger than the portion of the data line which is formed in the second semiconductor layer, to thereby form the data line having a stepwise shape with a larger number of steps. It is thus possible to achieve higher coverage properties of the protective insulating film formed on the data line, and higher yield of the active matrix substrate having the common electrode.

According to the third or twelfth aspect of the present invention, two-layered protective insulating films are formed by using the identical material, and hence two-layered protective insulating films capable of insulating between the pixel electrode layer and the common electrode layer can be easily formed even when there is a conductive foreign material on the substrate before forming the protective insulating film.

According to the fourth or thirteenth aspect of the present invention, there are formed two-layered protective insulating films in which stresses in opposite directions to each other are generated, to thereby enable cancelling of the stresses generated in the respective layers of the protective insulating film. It is thus possible to achieve high coverage properties of the protective insulating film, and high yield of the active matrix substrate having the common electrode.

According to the fifth or fourteenth aspect of the present invention, the stresses generated in the respective layers of the protective insulating films can be cancelled, and a leakage occurrence ratio of the data line and the common electrode can be suppressed. It is thus possible to achieve high coverage properties of the protective insulating film, and high yield of the active matrix substrate having the common electrode.

According to the sixth, seventh, fifteenth, or sixteenth aspect of the present invention, the main conductor part of the data line, and the like, are formed of molybdenum or a material containing molybdenum (e.g., an alloy of molybdenum and niobium), and hence it is possible to prevent occurrence of a generated foreign material and achieve high yield of the active matrix substrate having the common electrode.

According to the tenth aspect of the present invention, wet etching and dry etching are successively performed using the same photomask in the pixel electrode layer formation step, and hence the portion formed in the second semiconductor layer can be formed larger than the portions formed in the second wiring layer and the pixel electrode layer.

According to the eleventh aspect of the present invention, a difference in size of a pattern of a photomask to be used is set between the source layer formation step and the pixel electrode layer formation step, and hence the portion of the data line which is formed in the first semiconductor layer can be formed larger than the portion of the data line which is formed in the second semiconductor layer.

BRIEF DESCRIPTION OF THE DRAWINGS

FIG. 6 is a sectional view of a data line after completion of etching in a fourth process.

FIG. 7 is a sectional view of a TFT after completion of the etching in the fourth process.

FIG. 8 is a table showing an example of film formation conditions and characteristics of two-layered SiNx films of the active matrix substrate shown in FIG. 1.

MODE FOR CARRYING OUT THE INVENTION

Figure 1:
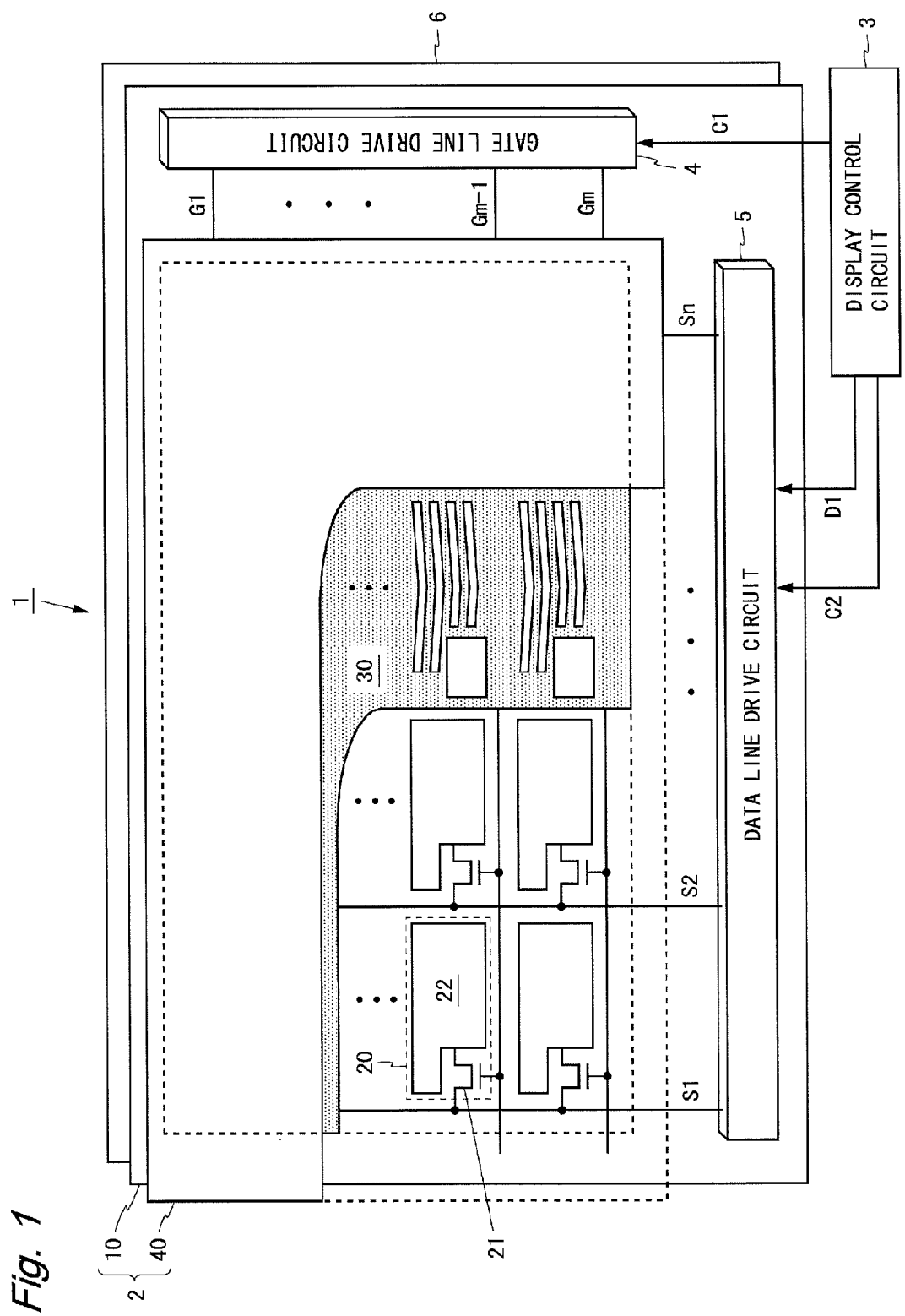
FIG. 1 is a block diagram showing a configuration of a liquid crystal display device provided with an active matrix substrate according to an embodiment of the present invention.

FIG. 1 is a block diagram showing a configuration of a liquid crystal display device provided with an active matrix substrate according to an embodiment of the present invention. A liquid crystal display device 1 shown in FIG. 1 includes a liquid crystal panel 2, a display control circuit 3, agate line drive circuit 4, a data line drive circuit 5, and a backlight 6. Hereinafter, m and n are integers not smaller than 2, i is an integer not smaller than 1 and not larger than m, and j is an integer not smaller than 1 and not larger than n.

The liquid crystal panel 2 is a liquid crystal panel of an FFS mode. The liquid crystal panel 2 has a structure formed by attaching an active matrix substrate 10 and a counter substrate 40 together, and providing a liquid crystal layer between the two substrates. A black matrix (not shown) and the like are formed on the counter substrate 40. m gate lines G1 to Gm, n data lines S1 to Sn, (m×n) pixel circuits 20, a common electrode 30 (dot pattern part), and the like are formed on the active matrix substrate 10. A semiconductor chip to function as the gate line drive circuit 4 and a semiconductor chip to function as the data line drive circuit 5 are mounted on the active matrix substrate 10. Note that FIG. 1 schematically shows the configuration of the liquid crystal display device 1, and shapes of the elements described in FIG. 1 are not accurate.

Hereinafter, a direction in which the gate line extends (a horizontal direction in the drawing) is referred to as a row direction, and a direction in which the data line extends (a vertical direction in the drawing) is referred to as a column direction. The gate lines G1 to Gm extend in the row direction and are arranged in parallel with each other. The data lines S1 to Sn extend in the column direction and are arranged in parallel with each other. The gate lines G1 to Gm and the data lines S1 to Sn intersect at (m×n) points. The (m×n) pixel circuits 20 are arranged two-dimensionally corresponding to the intersections of the gate lines G1 to Gm and the data lines S1 to Sn.

The pixel circuit 20 includes an N-channel TFT 21 and a pixel electrode 22. The TFT 21 included in the pixel circuit 20 in an i-th row and a j-th column has a gate electrode connected to a gate line Gi, a source electrode connected to a data line Sj, and a drain electrode connected to the pixel electrode 22. A protective insulating film (not shown) is formed in a layer over the gate lines G1 to Gm, the data lines S1 to Sn, the TFT 21, and the pixel electrode 22. The common electrode 30 is formed in a layer over the protective insulating film. The pixel electrode 22 and the common electrode 30 face each other with the protective insulating film interposed therebetween. The backlight 6 is disposed on the back surface side of the liquid crystal panel 2 and irradiates the back surface of the liquid crystal panel 2 with light.

The display control circuit 3 outputs a control signal C1 to the gate line drive circuit 4, and outputs a control signal C2 and a data signal D1 to the data line drive circuit 5. The gate line drive circuit 4 drives the gate lines G1 to Gm based on the control signal C1. The data line drive circuit 5 drives the data lines S1 to Sn based on the control signal C2 and the data signal D1. More specifically, the gate line drive circuit 4 selects one gate line from among of the gate lines G1 to Gm in each horizontal period (line period), and applies a high-level voltage to the selected gate line. The data line drive circuit 5 respectively applies n data voltages to the data lines S1 to Sn in accordance with the data signal D1 in each horizontal period. Hence, n pixel circuits 20 are selected within one horizontal period, and n data voltages are respectively written to the selected n pixel circuits 20.

Figure 2:
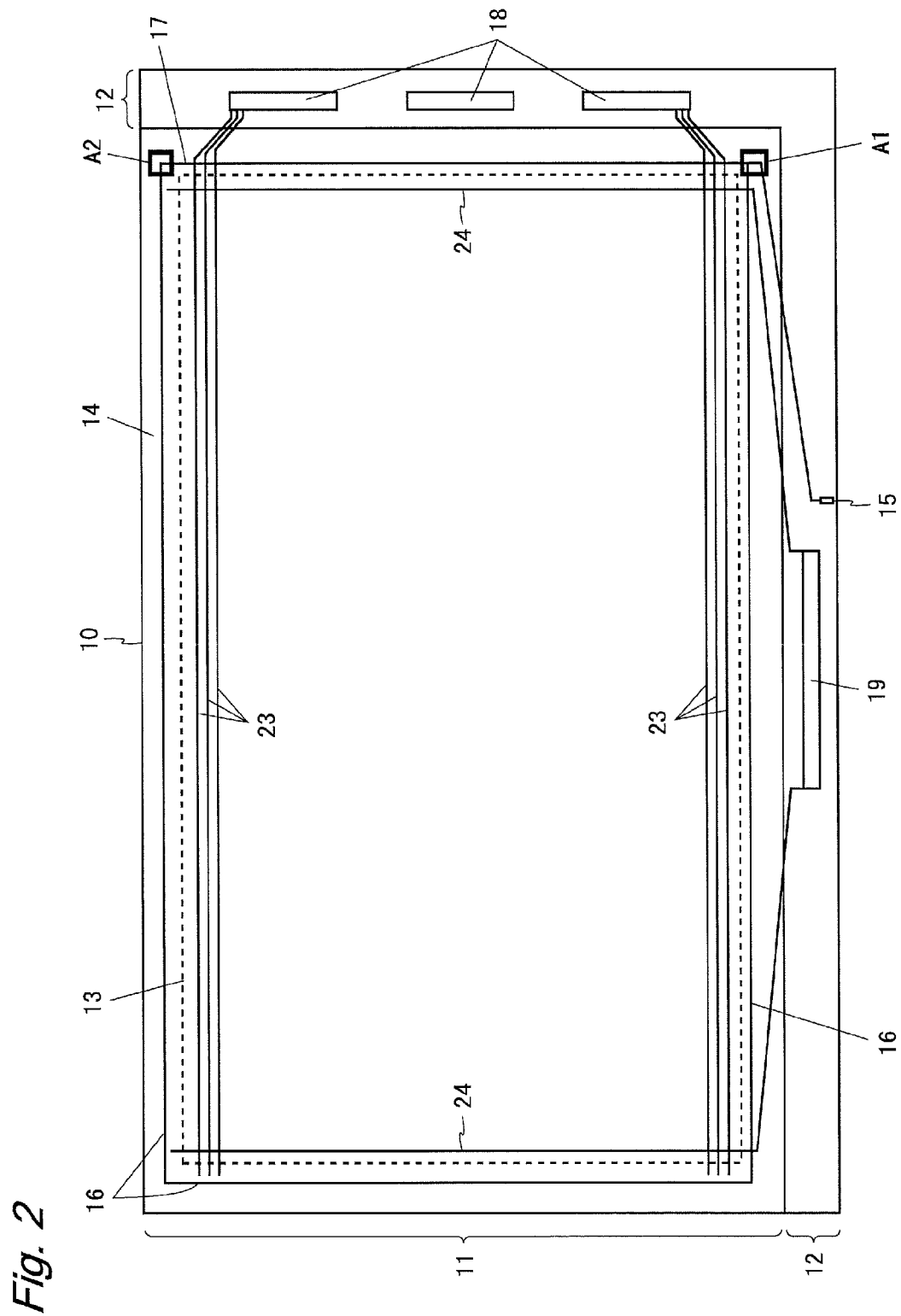
FIG. 2 is a plan view of the active matrix substrate shown in FIG. 1.

FIG. 2 is a plan view of the active matrix substrate 10. Part of elements formed on the active matrix substrate 10 is illustrated in FIG. 2. As shown in FIG. 2, the active matrix substrate 10 is divided into a counter region 11 facing the counter substrate 40, and a non-counter region 12 not facing the counter substrate 40. In FIG. 2, the non-counter region 12 is located in the right side and the lower side of the counter region 11. A display region 13 (a region shown by a broken line) for disposing the pixel circuits 20 is set in the counter region 11. A portion remaining after removing the display region 13 from the counter region 11 is referred to as a picture-frame region 14.

The (m×n) pixel circuits 20, the m gate lines 23, and the n data lines 24 are formed in the display region 13. The (m×n) pixel circuits 20 are arranged two-dimensionally in the display region 13. An external terminal 15 for inputting a common electrode signal is provided to the non-counter region 12. For applying to the common electrode 30 the common electrode signal inputted through the external terminal 15, a first common main wiring 16 formed in the same wiring layer as the gate line 23 and a second common main wiring 17 formed in the same wiring layer as the data line 24 are formed in the picture-frame region 14. In FIG. 2, the first common main wiring 16 is formed in the left side, the upper side, and the lower side of the display region 13, and the second common main wiring 17 is formed in the right side of the display region 13. Further, a connecting circuit (not shown) for connecting the common electrode 30, the first common main wiring 16, and the second common main wiring 17 is formed in each of an A1 part and an A2 part of FIG. 2. A mounting region 18 for mounting the gate line drive circuit 4 and a mounting region 19 for mounting the data line drive circuit 5 are set in the non-counter region 12.

The active matrix substrate 10 is formed by forming a gate layer, a gate insulating film, a first semiconductor layer, a second semiconductor layer, a source layer, a pixel electrode layer, a protective insulating film, and a common electrode layer over a glass substrate sequentially from the lowest layer (details are described later). The gate line 23 and the first common main wiring 16 are formed in the gate layer. The data line 24 and the second common main wiring 17 are laminated wirings formed in the first semiconductor layer, the second semiconductor layer, the source layer, and the pixel electrode layer.

Figure 3:
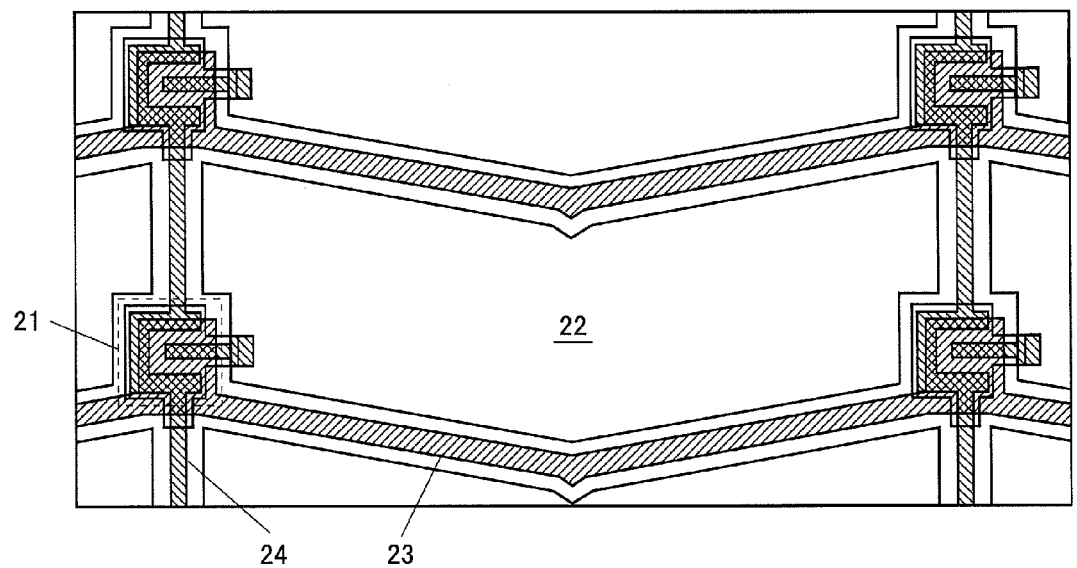
FIG. 3 is a diagram showing a pattern other than a common electrode of the active matrix substrate shown in FIG. 1.

FIG. 3 is a diagram showing a pattern other than the common electrode 30 of the active matrix substrate 10. As shown in FIG. 3, the gate line 23 (left down oblique line part) extends in the row direction while bending in the middle. The data line 24 (right down oblique line part) extends in the column direction while bending in the vicinity of an intersection with the gate line 23. The gate line 23 and the data line 24 are formed in different wiring layers. The TFT 21 is formed in the vicinity of the intersection of the gate line 23 and the data line 24. The pixel electrode 22 is formed in a region separated by the gate lines 23 and the data lines 24. The TFT 21 has a gate electrode connected to the gate line 23, a source electrode connected to the data line 24, and a drain electrode connected to the pixel electrode 22. In such a manner, the liquid crystal panel 2 is provided with a plurality of pixel circuits 20 arranged corresponding to intersections of the gate lines 23 and the data lines 24.

Figure 4:
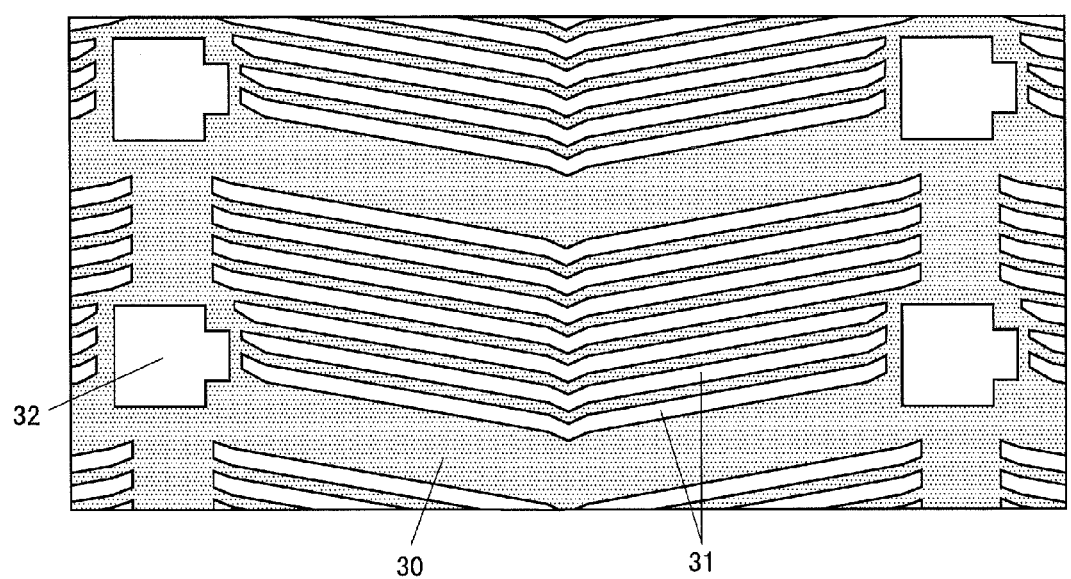
FIG. 4 is a diagram showing a pattern of the common electrode of the active matrix substrate shown in FIG. 1.

FIG. 4 is a diagram showing a pattern of the common electrode 30 of the active matrix substrate 10. The common electrode 30 is formed in a layer over the protective insulating film which is formed in a layer over the TFT 21, the pixel electrode 22, the gate line 23, and the data line 24 (i.e., closer side to the liquid crystal layer). As shown in FIG. 4, the common electrode 30 is formed so as to cover the whole surface of the display region 13 except for the following portions. The common electrode 30 has a plurality of slits 31 corresponding to the pixel electrode 22 so as to generate, together with the pixel electrode 22, a lateral electric field to be applied to the liquid crystal layer. In FIG. 4, the common electrode 30 has seven slits 31 corresponding to one pixel electrode 22. The slit 31 bends around its middle. It is possible to widen a view angle of the liquid crystal panel 2 by forming the bent slit 31 in the common electrode 30. Further, the common electrode 30 has a cutout 32 formed in a region including a source electrode disposed region and a channel region of the TFT 21. It is possible to prevent the common electrode 30 formed on the top of the TFT 21 from affecting an operation of the TFT 21, by providing the cutout 32 to the common electrode 30.

Hereinafter, a method for manufacturing the active matrix substrate 10 is described with reference to FIGS. 5A to 5K. (a) to (d) in FIGS. 5A to 5K respectively describe processes of forming the gate line 23, the data line 24, the TFT 21, and the connecting circuit.

Figure 5A:
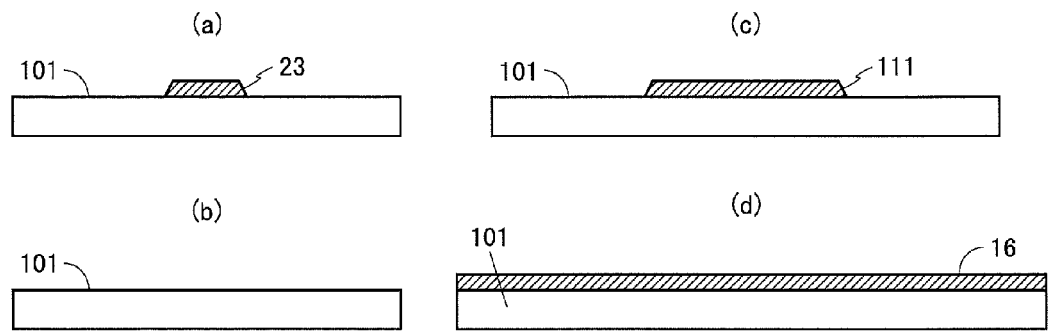
FIG. 5A is a diagram showing a method for manufacturing the active matrix substrate shown in FIG. 1.

(First Process) Formation of Gate Layer Pattern (FIG. 5A)

Ti (titanium), Al (aluminum), and Ti are formed successively on a glass substrate 101 by sputtering. Subsequently, a gate layer is patterned using photolithography and etching to form the gate line 23, the gate electrode 111 of the TFT 21, the first common main wiring 16, and the like. Patterning using photolithography and etching refers to the following processing. First, a photoresist is applied to the substrate. Next, the substrate is covered with a photomask having an intended pattern and is exposed to light, thereby to make a photoresist having the same pattern as that of the photomask remain on the substrate. Subsequently, the substrate is etched using the remaining photoresist as a mask to form a pattern on the surface of the substrate. Finally, the photoresist is peeled off.

Figure 5B:
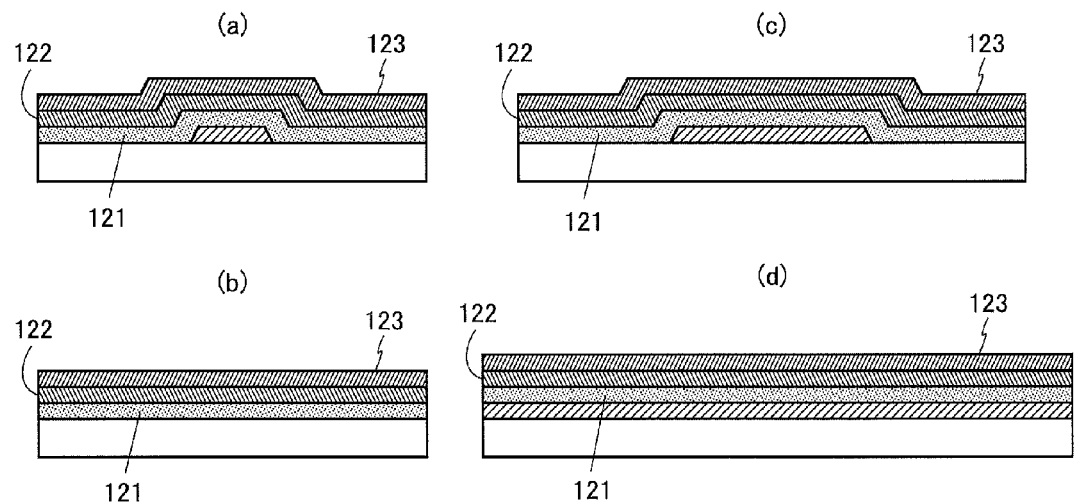
FIG. 5B is a diagram continued from FIG. 5A.

(Second Process) Formation of Semiconductor Layer (FIG. 5B)

A SiNx film 121 to be the gate insulating film, an amorphous Si film 122, and an n+amorphous Si film 123 are successively formed on the substrate shown in FIG. 5A by CVD (chemical vapor deposition). In the second process, the semiconductor layer is not patterned. Patterning of the semiconductor layer is performed along with patterning of the source layer in a third process.

Figure 5C:
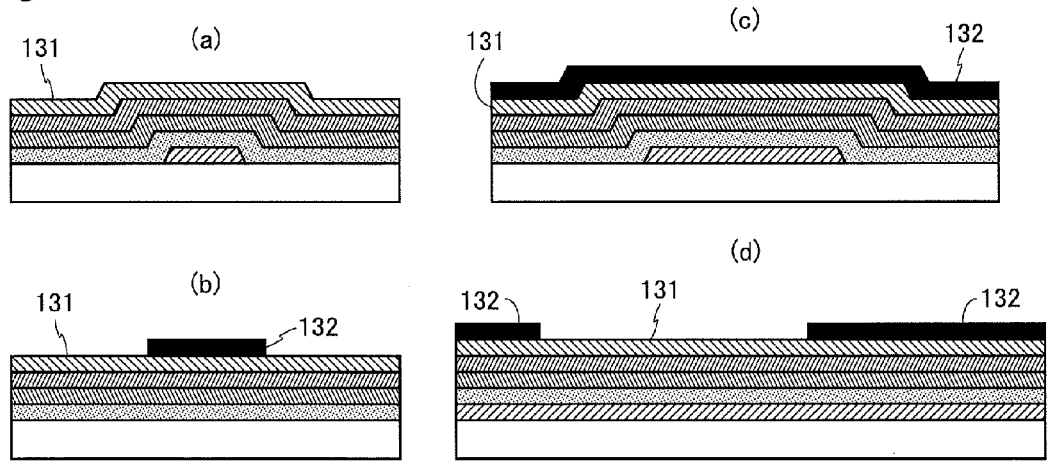
FIG. 5C is a diagram continued from FIG. 5B.
Figure 5D:
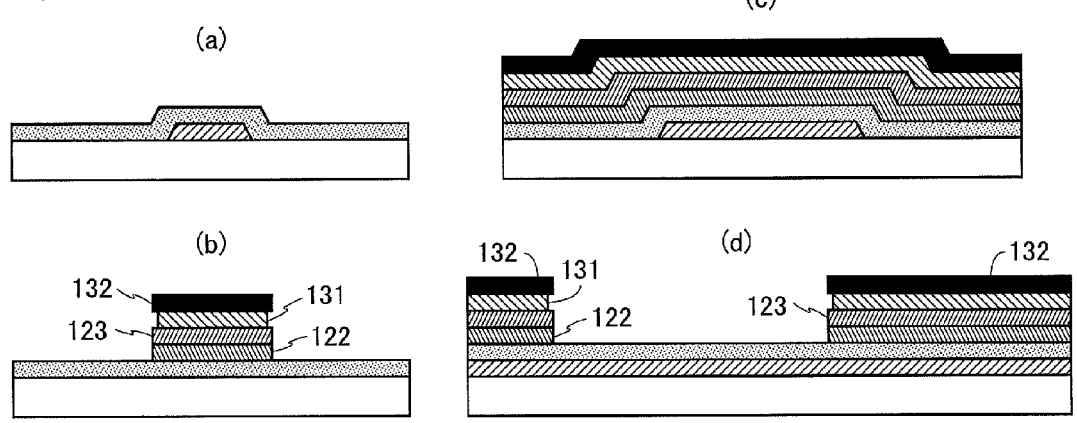
FIG. 5D is a diagram continued from FIG. 5C.
Figure 5E:
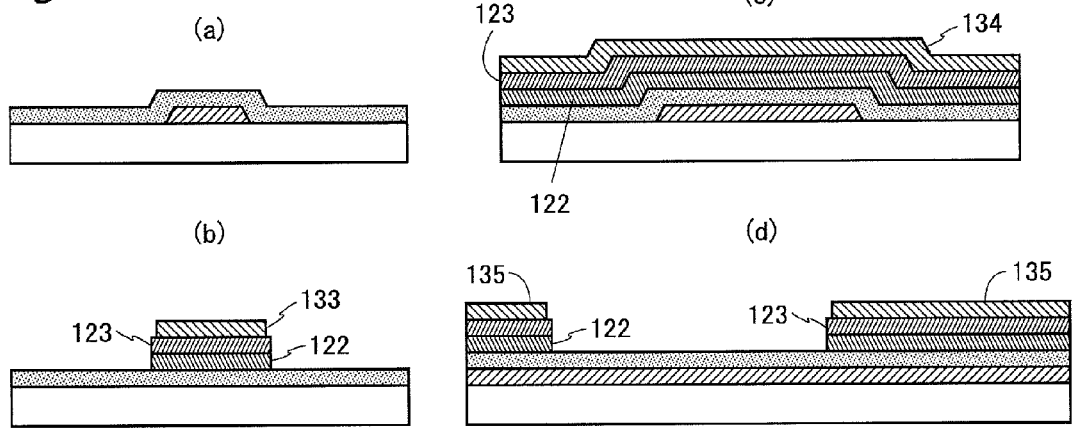
FIG. 5E is a diagram continued from FIG. 5D.

(Third Process) Formation of Source Layer Pattern (FIGS. 5C to 5E)

A MoNb (molybdenum niobium) film 131 is formed on the substrate shown in FIG. 5B by sputtering. Subsequently, the source layer and the semiconductor layer are patterned using photolithography and etching to form a main conductor part 133 of the data line 24, a conductor part 134 of the TFT 21, a main conductor part 135 of the second common main wiring 17, and the like. The conductor part 134 of the TFT 21 is formed in the positions of the source electrode, the drain electrode, and the channel region of the TFT 21. In the third process, there is used a photomask for making a photoresist 132 remain in the positions of the main conductor parts 133, 135, the conductor part 134, and the like. For this reason, after exposure to light, the photoresist 132 remains in the positions of the main conductor parts 133, 135, the conductor part 134, and the like (FIG. 5C). Using the photoresist 132 as a mask, the MoNb film 131 formed in the third process is at first etched, and then the n+amorphous Si film 123 and the amorphous Si film 122 formed in the second process are etched successively (FIG. 5D). The amorphous Si film 122 and the n+amorphous Si film 123 are thereby patterned in almost the same shape as that of the source layer. Finally, the photoresist 132 is peeled off to obtain a substrate shown in FIG. 5E. In the substrate shown in FIG. 5E, the remaining MoNb film 131 which is not etched becomes the main conductor part 133 of the data line 24, the conductor part 134 of the TFT 21, the main conductor part 135 of the second common main wiring 17, and the like. In the substrate shown in FIG. 5E, the amorphous Si film 122 and the n+amorphous Si film 123 exist in layers under the main conductor part 133 of the data line 24, the conductor part 134 of the TFT 21, and the main conductor part 135 of the second common main wiring 17.

(Fourth Process) Formation of Pixel Electrode (FIGS. 5F to 5I)

Figure 5F:
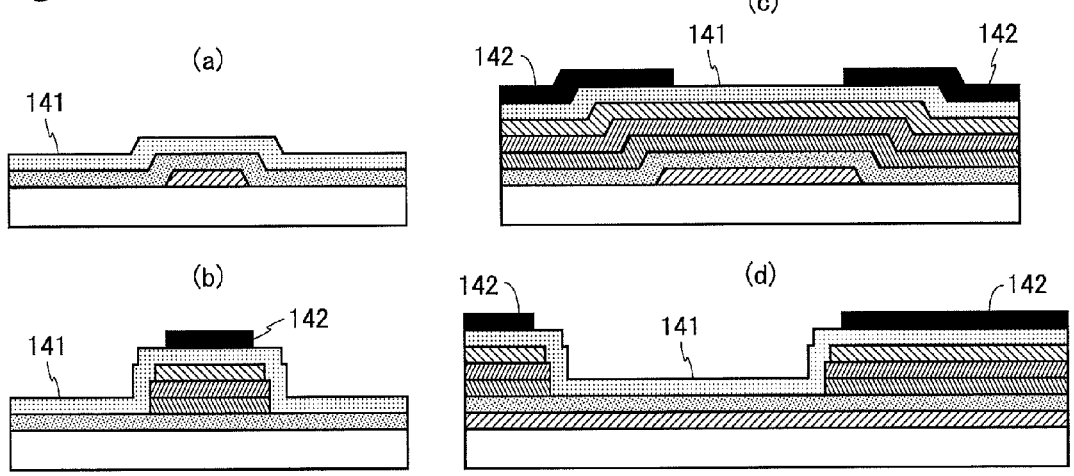
FIG. 5F is a diagram continued from FIG. 5E.
Figure 5G:
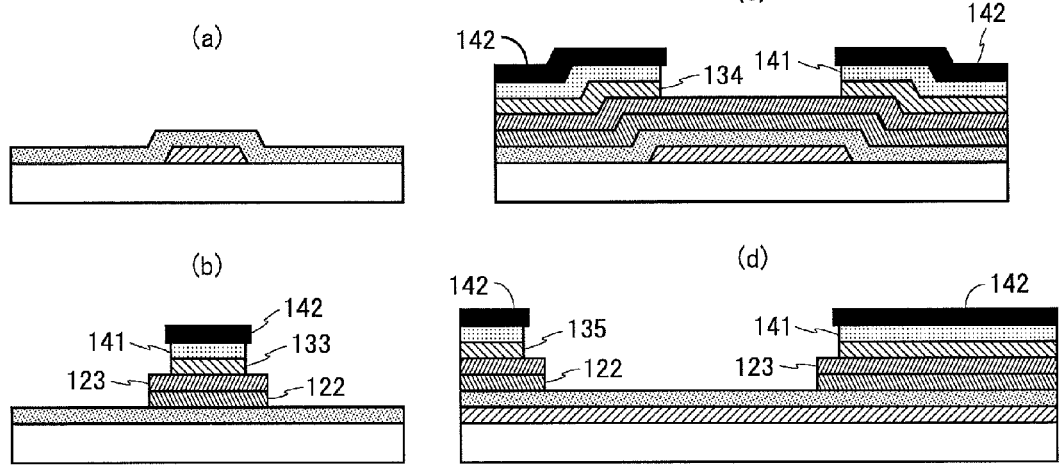
FIG. 5G is a diagram continued from FIG. 5F.
Figure 5H:
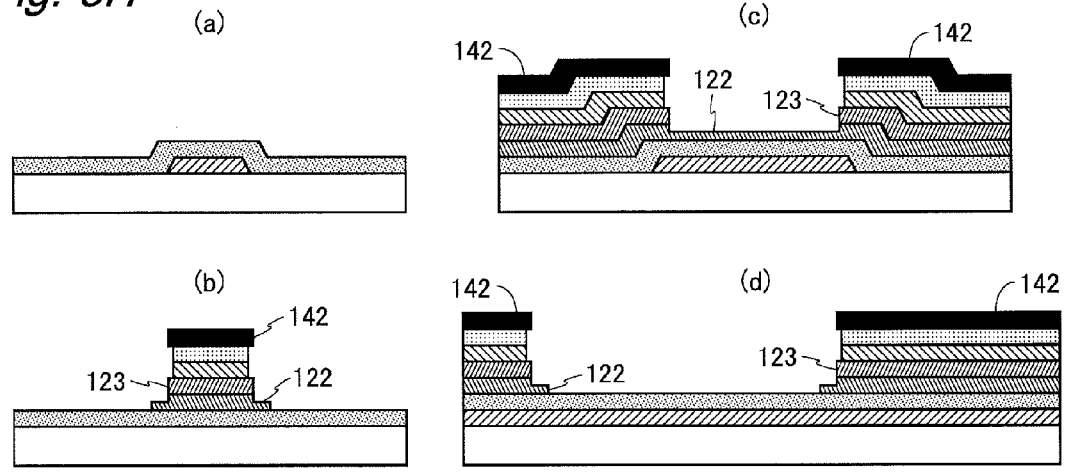
FIG. 5H is a diagram continued from FIG. 5G.

An IZO film 141 to be the pixel electrode 22 is formed on the substrate shown in FIG. 5E by sputtering. Subsequently, the pixel electrode layer is patterned using photolithography and etching. In the fourth process, there is used a photomask for making a photoresist 142 remain in the position of the pixel electrode 22 and the position of the source layer pattern (except for the position of the channel region of the TFT 21). For this reason, after exposure to light, the photoresist 142 remains in the position of the pixel electrode 22 and the position of the source layer pattern except for the position of the channel region of the TFT 21 (FIG. 5F). Using the photoresist 142 as a mask, the IZO film 141 and the conductor part 134 existing in the position of the channel region of the TFT 21 are at first etched by wet etching, and then the n+amorphous Si film 123 existing in the position of the channel region of the TFT 21 is etched by dry etching (FIGS. 5G and 5H). FIG. 5G illustrates a substrate when etching of the conductor part 134 is completed. FIG. 5H illustrates a substrate when etching of the n+amorphous Si film 123 is completed. As shown in FIG. 5H, a film thickness of the amorphous Si film 122 existing in the channel region of the TFT 21 becomes thin by dry etching. Finally, the photoresist 142 is peeled off to obtain a substrate shown in FIG. 5I. In the substrate shown in FIG. 5I, the channel region of the TFT 21 is formed, and a source electrode 143 and a drain electrode 144 of the TFT 21 become a separate state. The IZO film 141 remains in a layer over the main conductor part 133 of the data line 24, the source electrode 143 and the drain electrode 144 of the TFT 21, and the main conductor part 135 of the second common main wiring 17.

Figure 5I:
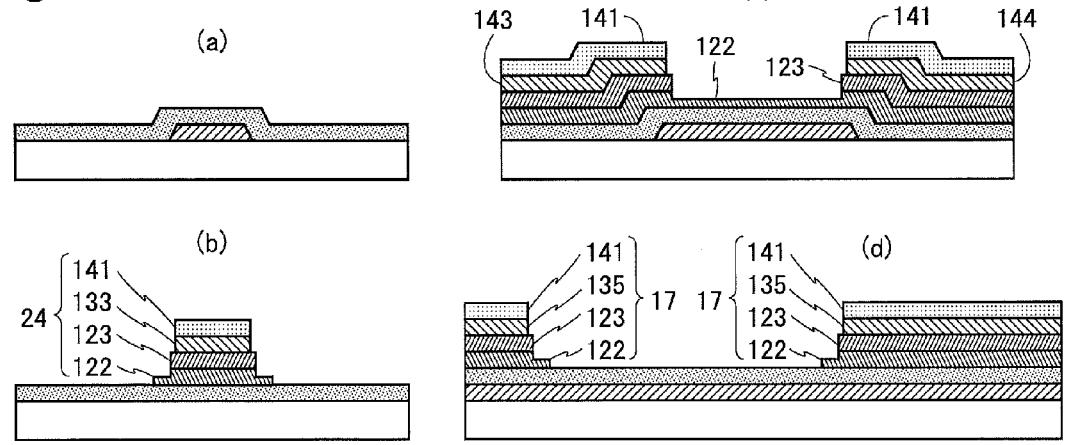
FIG. 5I is a diagram continued from FIG. 5H.
Figure 5J:
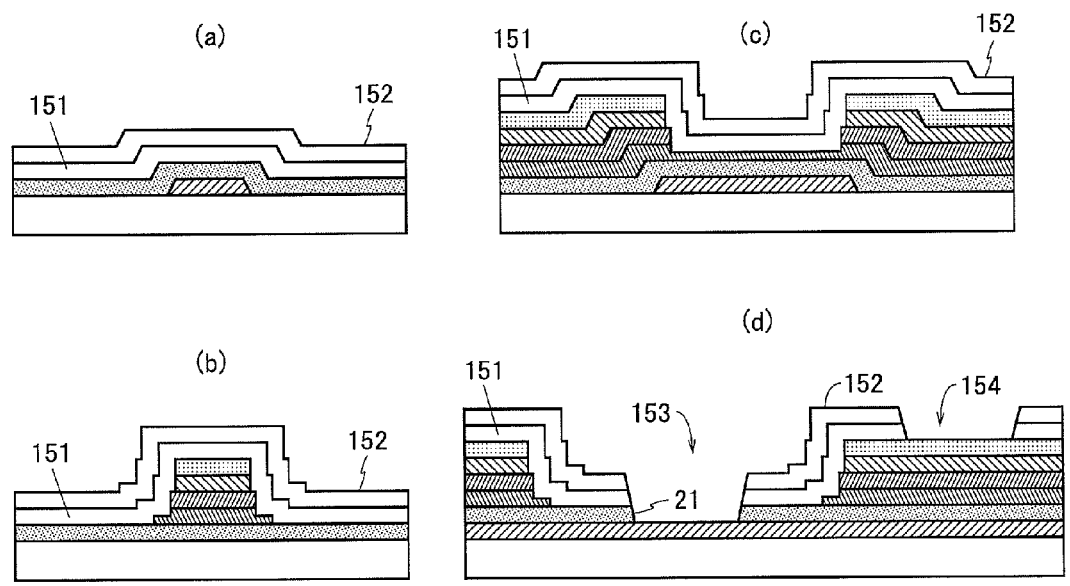
FIG. 5J is a diagram continued from FIG. 5I.

(Fifth Process) Formation of Protective Insulating Film (FIG. 5J)

Two-layered SiNx films 151, 152 to be the protective insulating film are sequentially formed on the substrate shown in FIG. 5I by CVD. Film formation conditions for the lower SiNx film 151 and film formation conditions for the upper SiNx film 152 are different (details are described later). Subsequently, the two-layered SiNx films 151, 152 formed in the fifth process and the SiNx film 121 formed in the second process are patterned using photolithography and etching. As shown in FIG. 5J(d), a contact hole 153 penetrating the two-layered SiNx films 151, 152 and the SiNx film 121, and a contact hole 154 penetrating the two-layered SiNx films 151, 152 are formed in a position for forming the connecting circuit.

Figure 5K:
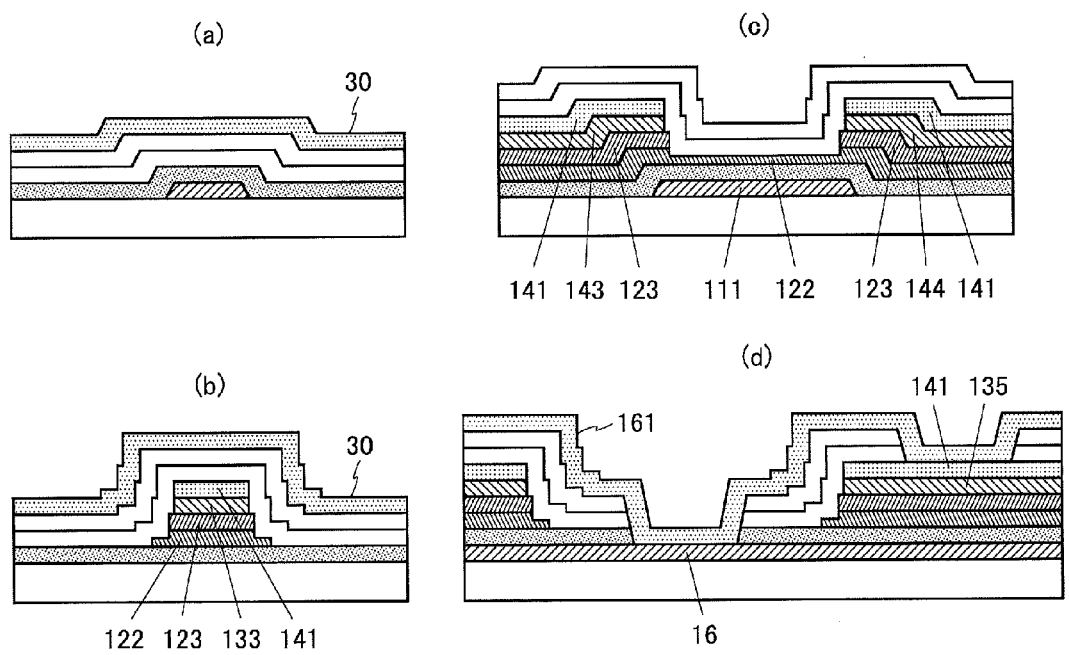
FIG. 5K is a diagram continued from FIG. 5J.

(Sixth Process) Formation of Common Electrode (FIG. 5K)

An IZO film to be the common electrode 30 is formed on the substrate shown in FIG. 5J by sputtering. Subsequently, a common electrode layer is patterned using photolithography and etching to form the common electrode 30 and a connecting electrode 161. As shown in FIG. 5K(d), the connecting electrode 161 comes into direct contact with the first common main wiring 16 in the position of the contact hole 153, and is electrically connected to the main conductor part 135 of the second common main wiring 17 via the IZO film 141 in the position of the contact hole 154. Further, the connecting electrode 161 is formed integrally with the common electrode 30. Accordingly, the common electrode 30, the first common main wiring 16, and the second common main wiring 17 can be electrically connected by using the connecting electrode 161.

A photomask used in the sixth process has a pattern corresponding to the slits 31 and the cutouts 32. The common electrode 30 having the slits 31 and the cutouts 32 can be formed by using such a photomask. It is possible to manufacture the active matrix substrate 10 having the cross-sectional structure shown in FIG. 5K, by performing the first to sixth processes described above.

The data line 24 is the laminated wiring formed in the first semiconductor layer, the second semiconductor layer, the source layer, and the pixel electrode layer (laminated wiring made up of the amorphous Si film 122, the n+amorphous Si film 123, the main conductor part 133, and the IZO film 141) (see FIG. 5K(b)). Further, the TFT 21 includes the gate electrode 111 formed in the gate layer, the source electrode 143 and the drain electrode 144 which are formed in the source layer, the channel region (amorphous Si film 122) formed in the first semiconductor layer, the semiconductor part (n+amorphous Si film 123) formed in the second semiconductor layer and under the source electrode 143 and the drain electrode 144, and the conductor part (IZO film 141) formed in the pixel electrode layer and on the source electrode 143 and the drain electrode 144 (see FIG. 5K(c)).

In the manufacturing method according to the present embodiment, photolithography is performed using the different photomasks in the first and third to sixth processes, and the photolithography is not performed in the second process. The number of photomasks used in the manufacturing method according to the present embodiment is five in total. When the gate line 23 is formed in the first process and when the main conductor part 133 of the data line 24, and the like are formed in the third process, Cu (copper), Mo (molybdenum), Al, Ti, TiN (titanium nitride), an alloy of these, or a laminated film of these metals may be used in place of the above materials. For example, as the wiring materials for the gate line 23, the main conductor part 133 of the data line 24, and the like, there may be used a three-layer film formed by laminating an Al alloy in a layer over MoNb, and further laminating MoNb in a layer over the Al alloy. Further, when the pixel electrode 22 is formed in the fourth process and when the common electrode 30 and the connecting electrode 161 are formed in the sixth process, ITO (indium tin oxide) may be used in place of IZO. Moreover, when the protective insulating film is formed in the fifth process, laminated films of SiOx (silicon oxide) films or SiON (silicon oxy-nitride) films may be used in place of the SiNx films.

In the manufacturing method according to the present embodiment, thicknesses of a variety of films formed on the substrate are preferably decided in accordance with materials, functions and the like of the films. The thickness of the film is about 10 nm to 1 μm, for example. Hereinafter, one example of the film thickness is described. For example, in the first process, the Ti film with a thickness of 25 to 35 nm, the Al film with a thickness of 180 to 220 nm, and the Ti film with a thickness of 90 to 110 nm are formed sequentially. In the second process, the SiNx film 121 with a thickness of 360 to 450 nm, the amorphous Si film 122 with a thickness of 100 to 200 nm, and the n+amorphous Si film 123 with a thickness of 30 to 80 nm may be formed successively. In the third process, the MoNb film 131 with a thickness of 180 to 220 nm is formed, and in the fourth process, the IZO film 141 with a thickness of 50 to 80 nm is formed. In the fifth process, the lower SiNx film 151 with a thickness of 220 to 280 nm and the upper SiNx film 152 with a thickness of 450 to 550 nm are formed, and in the sixth process, the IZO film with a thickness of 110 to 140 nm is formed.

Hereinafter, features and advantageous effects of the active matrix substrate 10 according to the present embodiment are described. First, the active matrix substrate 10 has a feature (hereinafter referred to as a first feature) that the n+amorphous Si film 123 is formed larger than the main conductor part 133 and the IZO film 141 in the position of the data line 24, and the n+amorphous Si film 123 is formed larger than the source electrode 143, the drain electrode 144, and the IZO film 141 in the position of the TFT 21.

FIG. 6 is a sectional view of the data line 24 after completion of the etching in the fourth process. FIG. 7 is a sectional view of the TFT 21 after completion of the etching in the fourth process. FIGS. 6 and 7 respectively describe FIGS. 5H(b) and 5H(c) in more detail. FIGS. 6 and 7 illustrate the photoresist 142 formed in the fourth process. Hereinafter, a region which is covered with the photoresist 142 when the substrate is seen from right above, is referred to as a covered region.

The covered region of the photoresist 142 is decided by a pattern of a photomask used in the fourth process (hereinafter referred to as a photomask for the pixel electrode layer). In the etching of the fourth process, using the photoresist 142 as the mask, the IZO film 141 and the conductor part 134 that exists in the position of the channel region of the TFT 21 are etched by wet etching, and the n+amorphous Si film 123 that exists in the position of the channel region of the TFT 21 is etched by dry etching. The IZO film 141, the main conductor part 133, and the n+amorphous Si film 123 which are in the position of the data line 24 are also etched by this etching simultaneously.

In the etching of the fourth process, since the n+amorphous Si film 123 is subjected to dry etching with using the photoresist 142 as the mask, the n+amorphous Si film 123 is etched almost as the pattern of the photoresist 142 (i.e., pattern of the photomask for the pixel electrode layer). Specifically, the n+amorphous Si film 123 being outside the covered region of the photoresist 142 is etched to be removed, and the n+amorphous Si film 123 being within the covered region of the photoresist 142 is not etched to remain. Accordingly, the position of an end E2 of the n+amorphous Si film 123 becomes almost equal to the end of the photoresist 142.

In contrast, the main conductor part 133 of the data line 24, the conductor part 134, and the IZO film 141 formed in the layer over these parts are etched to be smaller than the pattern of the photoresist 142 since etch shift occurs in wet etching. Specifically, the main conductor part 133, the conductor part 134, and the IZO film 141 which exist in the covered region of the photoresist 142 and within a predetermined distance from the end of the covered region are etched to be removed in addition to those which exist outside the covered region of the photoresist 142. Accordingly, in FIG. 6, the position of an end E1 of the main conductor part 133 and the IZO film 141 is more inside the covered region of the photoresist 142 than the position of the end E2 of the n+amorphous Si film 123. In FIG. 7, the end E1 of the source electrode 143, the drain electrode 144, and the IZO film 141 is more inside the covered region of the photoresist 142 than the end E2 of the n+amorphous Si film 123.

By performing the etching of the fourth process, the n+amorphous Si film 123 is formed larger than the main conductor part 133 and the IZO film 141 in the position of the data line 24, and the n+amorphous Si film 123 is formed larger than the source electrode 143, the drain electrode 144, and the IZO film 141 in the position of the TFT 21. Accordingly, it is possible to realize the first feature by performing the etching of the fourth process.

In such a manner, in the active matrix substrate 10, the portion formed in the lower layer (second semiconductor layer) is formed larger than the portion formed in the upper layer (source layer and pixel electrode layer), to thereby form a cross sectional shape of the data line 24, and the source electrode 143 and the drain electrode 144 of the TFT 21 in a stepwise manner. It is thus possible to achieve high coverage properties of the protective insulating film formed on the data line 24 and the TFT 21, and high yield of the active matrix substrate 10 having the common electrode 30.

Secondly, the active matrix substrate 10 has a feature (hereinafter referred to as a second feature) that the amorphous Si film 122 is formed larger than the n+amorphous Si film 123 in the position of the data line 24.

In FIGS. 6 and 7, the position of an end E3 of the amorphous Si film 122 is decided in accordance with a pattern of a photomask used in the third process (hereinafter referred to as a photomask for the source layer) (see FIGS. 5D and 5H). In order to form the amorphous Si film 122 larger than the n+amorphous Si film 123 in the position of the data line 24, the pattern of the photomask for the source layer is made larger by a predetermined amount (e.g., 1 μm or larger) than the pattern of the photomask for the pixel electrode layer in the position of the data line 24. Accordingly, in FIG. 6, the position of the end E3 of the amorphous Si film 122 is more outside the covered region of the photoresist 142 than the position of the end E2 of the n+amorphous Si film 123. Hence, it is possible to realize the second feature.

In such a manner, in the active matrix substrate 10, the portion of the data line 24 which is formed in the first semiconductor layer is formed larger than the portion of the data line 24 which is formed in the second semiconductor layer, to thereby form the data line 24 having a stepwise shape with a larger number of steps. It is thus possible to achieve higher coverage properties of the protective insulating film formed on the data line 24, and higher yield of the active matrix substrate 10 having the common electrode 30.

Thirdly, the active matrix substrate 10 has a feature (hereinafter referred to as a third feature) of including an upper layer insulating film and a lower layer insulating film as the protective insulating film, in which a compressive stress is generated in one film, and a tensile stress is generated in the other film. As described above, the protective insulating film made up of the two-layered SiNx films 151, 152 are formed in the fifth process (FIG. 5J), and the film formation conditions for the lower SiNx film 151 and the film formation conditions for the upper SiNx film 152 are different. For example, a high-density thin film formed under a high temperature condition is used as the lower SiNx film 151, and a low-density thin film formed under a low temperature condition is used as the upper SiNx film 152. Further, the lower SiNx film 151 and the upper SiNx film 152 are formed so as to generate stresses in opposite directions to each other.

FIG. 8 is a table showing an example of the film formation conditions and characteristics of the two-layered SiNx films. In the example shown in FIG. 8, a film formation temperature of the lower SiNx film 151 is 270±10° C., and a film formation temperature of the upper SiNx film 152 is 210±10° C. Hence, the lower SiNx film 151 becomes a film with poor step coverage and a high density, and the upper SiNx film 152 becomes a film with good step coverage and a low density. When the film thickness is 500 nm, a compressive stress of 380 MPa is generated in the lower SiNx film 151, and a tensile stress of 160 MPa is generated in the upper SiNx film 152.

Figure 9:
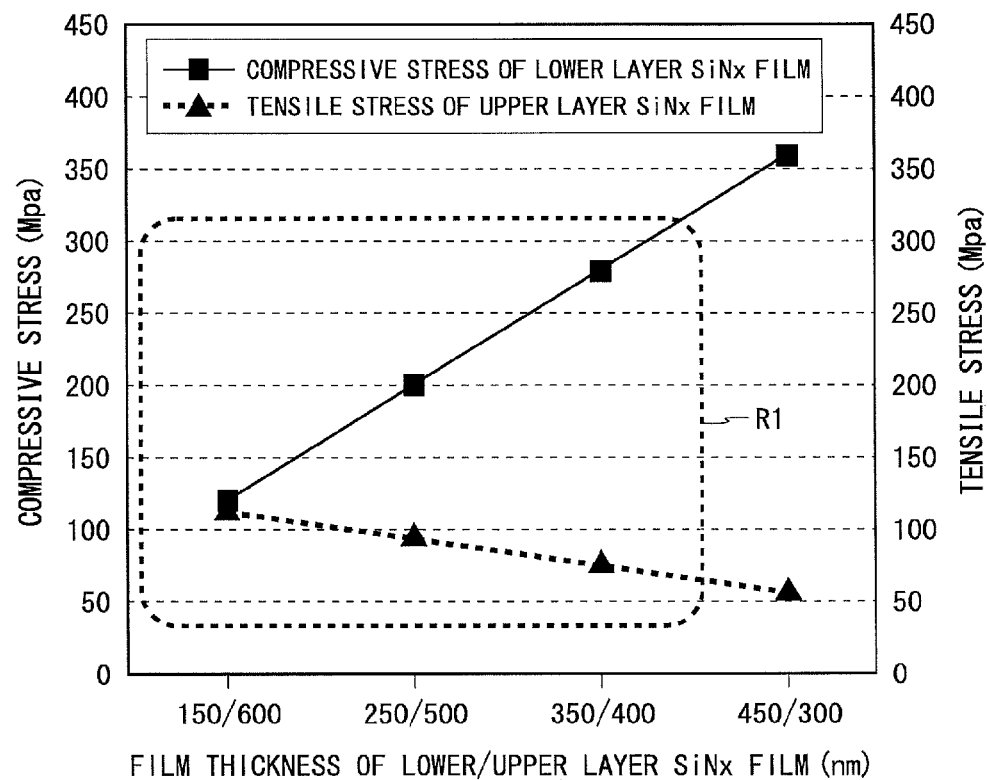
FIG. 9 is a diagram showing the relationship between a thickness and film stress of each of the two-layered SiNx films of the active matrix substrate shown in FIG. 1.

FIG. 9 is a diagram showing the relationship between a thickness and film stress of each of the two-layered SiNx films. FIG. 9 describes the relationship between the thickness and the compressive stress of the lower SiNx film 151, and the relationship between the thickness and the tensile stress of the upper SiNx film 152. The compressive stress generated in the lower SiNx film 151 and the tensile stress generated in the upper SiNx film 152 are cancelled, and the smaller the difference between the two stresses is, the higher the coverage properties of the protective insulating film becomes. Within a range R1 shown by a broken line in FIG. 9, the difference between the compressive stress generated in the lower SiNx film 151 and the tensile stress generated in the upper SiNx film 152 is small. The thicknesses of the two-layered SiNx films 151, 152 are decided so as to fall within the range R1, for example.

Figure 10:
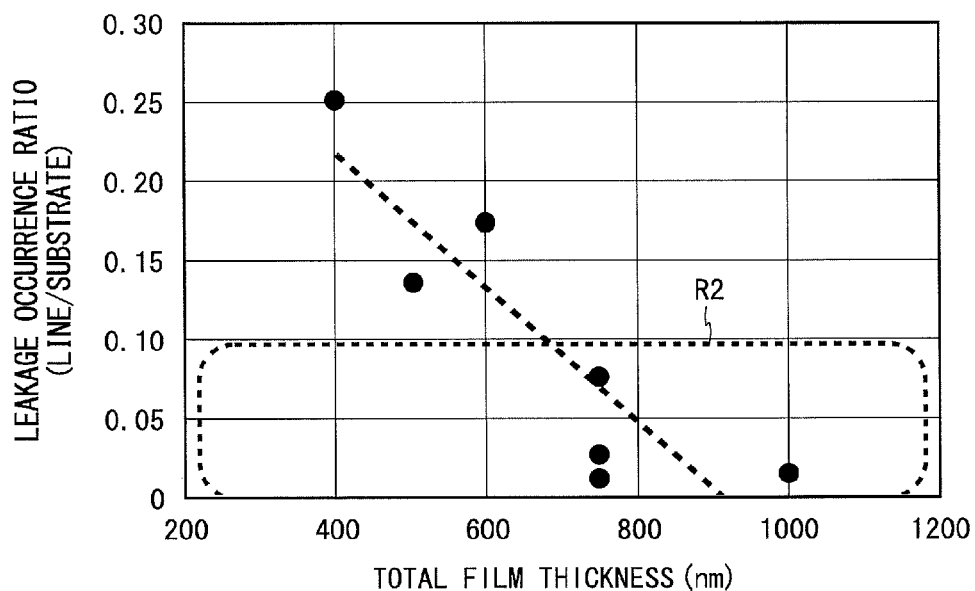
FIG. 10 is a diagram showing the relationship between a total thickness of the two-layered SiNx films and a leakage occurrence ratio of a data line and a common electrode in the active matrix substrate shown in FIG. 1.

FIG. 10 is a diagram showing the relationship between a total thickness of the two-layered SiNx films and a leakage occurrence ratio of the data line and the common electrode. As shown in FIG. 10, the larger the total film thickness is, the lower the leakage occurrence ratio becomes. Within a range R2 shown by a broken line in FIG. 10, the leakage occurrence ratio is sufficiently low, to be 0.10 line per substrate. The thicknesses of the two-layered SiNx films 151, 152 are, for example, decided such that the total film thickness falls within the range R2. As a result of making a comprehensive judgement based on results shown in FIGS. 9 and 10, a production processing capacity, and the like, for example, the thickness of the lower SiNx film 151 is decided to be 250±100 nm, and the thickness of the upper SiNx film 152 is decided to be 500±100 nm. In this case, the thickness of the lower SiNx film 151 is 150 to 350 nm, and the thickness of the upper SiNx film 152 is 400 to 600 nm.

In such a manner, in the active matrix substrate 10, there are formed two-layered protective insulating films in which stresses in opposite directions to each other are generated. Hence, the stresses generated in the respective layers of the protective insulating film can be cancelled. It is thus possible to achieve high coverage properties of the protective insulating film, and high yield of the active matrix substrate 10 having the common electrode 30.

Further, even when there is a conductive foreign material on the substrate before forming the protective insulating film, it is possible to cover the foreign material by using the two-layered protective insulating films, and insulate the pixel electrode layer located in the layer under the lower SiNx film 151 and the common electrode layer located in the layer over the upper SiNx film 152. Further, the pixel electrode layer and the common electrode layer can be insulated from each other by using the upper SiNx film 152 when a pinhole is in the lower SiNx film 151, and by using the lower SiNx film 151 when a pinhole is in the upper SiNx film 152. Further, it is possible to form the two-layered protective insulating films easily, by forming the two-layered protective insulating films using an identical material (SiNx).

Fourthly, the active matrix substrate 10 has a feature (hereinafter referred to as a fourth feature) that the main conductor part 133 of the data line 24, and the source electrode 143 and the drain electrode 144 of the TFT 21 are formed of molybdenum or a material containing molybdenum (hereinafter referred to as a Mo-based material). It is considered that an Al-based material is used in the third process when forming the source layer pattern, as in the first process. However, when the source layer pattern is formed using the Al-based material, a generated foreign material tends to occur due to hillock, corrosion, splash, and the like. Hence, in the manufacturing method according to the present embodiment, when forming the source layer pattern in the third process, the Mo-based material is used in place of the Al-based material.

In such a manner, in the active matrix substrate 10, the main conductor part 133 of the data line 24 and the source electrode 143 and the drain electrode 144 of the TFT 21 are formed of the Mo-based material (e.g., MoNb which is an alloy of molybdenum and niobium). Therefore, it is possible to prevent occurrence of a generated foreign material, and achieve high yield of the active matrix substrate 10 having the common electrode 30.

Further, when the main conductor part 133 of the data line 24 is formed using the Al-based material in order to reduce the resistance of the data line 24, a conductive film using the Mo-based material (e.g., MoNb which is an alloy of molybdenum and niobium) is preferably formed in a layer over the main conductor part 133 formed of the Al-based material and in a layer under the IZO film 141. Also with such a configuration, it is possible to suppress deterioration in yield due to hillock and the like of the Al-based material.

As shown above, the active matrix substrate 10 according to the present embodiment includes a plurality of gate lines 23 formed in a first wiring layer (gate layer); a plurality of data lines 24, each of which is a laminated wiring formed in a first semiconductor layer, a second semiconductor layer, a second wiring layer (source layer), and a pixel electrode layer; a plurality of pixel circuits 20 arranged corresponding to intersections of the gate lines 23 and the data lines 24 and each including a switching element (TFT 21) and a pixel electrode 22; a protective insulating film (SiNx films 151, 152) formed in a layer over the gate line 23, the data line 24, the switching element, and the pixel electrode 22; and a common electrode 30 formed in a layer over the protective insulating film. The switching element includes a gate electrode 111 formed in the first wiring layer, a source electrode 143 and a drain electrode 144 formed in the second wiring layer, a channel region (amorphous Si film 122) formed in the first semiconductor layer, a semiconductor part (n+amorphous Si film 123) formed in the second semiconductor layer and under the source electrode 143 and the drain electrode 144, and a conductor part (IZO film 141) formed in the pixel electrode layer and on the source electrode 143 and the drain electrode 144. A portion (n+amorphous Si film 123) of the data line 24 which is formed in the second semiconductor layer is formed larger than portions (main conductor part 133 and IZO film 141) of the data line 24 which are formed in the second wiring layer and the pixel electrode layer, and the semiconductor part is formed larger than the source electrode 143, the drain electrode 144, and the conductor part.

The method for manufacturing the active matrix substrate 10 includes: a step (first process) of forming a plurality of gate lines 23 and gate electrodes 111 of a plurality of switching elements in a first wiring layer; a step (second process) of forming a gate insulating film (SiNx film 121), forming a first semiconductor film (amorphous Si film 122) in a first semiconductor layer, and forming a second semiconductor film (n+amorphous Si film 123) in a second semiconductor layer; a source layer formation step (third process) of forming, in a second wiring layer, a first conductor part (main conductor part 133 shown in FIG. 5E(b)) to be a base of a main conductor part 133 of a plurality of data lines 24, and a second conductor part (conductor part 134) to be a base of a source electrode 143 and a drain electrode 144 of the switching element, while patterning the first and second semiconductor films to form a second semiconductor part (amorphous Si film 122 and n+amorphous Si film 123 shown in FIG. 5E(b)) to be a base of a first semiconductor part located under the main conductor part 133, a channel region (amorphous Si film 122) of the switching element which is located in the first semiconductor layer, and a third semiconductor part (n+amorphous Si film 123 shown in FIG. 5E(c)) to be a base of a semiconductor part located under the source electrode 143 and the drain electrode 144 in the second semiconductor layer; a pixel electrode layer formation step (fourth process) of forming, in a pixel electrode layer, a pixel electrode 22, a third conductor part (IZO film 141 shown in FIG. 5I(b)) located on the main conductor part 133, and a conductor part (IZO film 141 shown in FIG. 5I(c)) located on the source electrode 143 and the drain electrode 144, while patterning the first and second conductor parts, a portion of the second semiconductor part which is formed in the second semiconductor layer, and the third semiconductor part, to form the main conductor part 133, the source electrode 143, the drain electrode 144, the first semiconductor part (amorphous Si film 122 and n+amorphous Si film 123 shown in FIG. 5I(b)), and the semiconductor part (n+amorphous Si film 123 shown in FIG. 5I(c)); a step (fifth process) of forming a protective insulating film in a layer over the pixel electrode 22; and a step (sixth process) of forming a common electrode 30 in a layer over the protective insulating film. In the pixel electrode layer formation step, a portion (n+amorphous Si film 123 shown in FIG. 5I(c)) of the first semiconductor part which is formed in the second semiconductor layer is formed larger than the main conductor part 133 and the third conductor part, and the semiconductor part is formed larger than the source electrode 143, the drain electrode 144, and the conductor part.

In such a manner, the portion formed in the lower layer (second semiconductor layer) is formed larger than the portion formed in the upper layer (second wiring layer and pixel electrode layer), and hence, the cross sectional shape of the data line 24, and the source electrode and the drain electrode of the switching element are formed in a stepwise manner. It is thus possible to achieve high coverage properties of the protective insulating film formed on the data line 24 and the switching element, and high yield of the active matrix substrate having the common electrode 30.

The pixel electrode layer formation step includes film formation processing, photoresist formation processing, etching processing, and photoresist peeling processing. In the etching processing, using a photoresist 142 formed in the photoresist formation processing as a mask, wet etching is performed on a film (IZO film 141) obtained in the film formation processing, and the first and second conductor parts, and dry etching is performed on the portion of the second semiconductor part which is formed in the second semiconductor layer, and the third semiconductor part. In such a manner, wet etching and dry etching are successively performed using the same photomask in the pixel electrode layer formation step, and hence the portion formed in the second semiconductor layer can be formed larger than the portions formed in the second wiring layer and the pixel electrode layer.

Further, in the active matrix substrate 10, a portion of the data line 24 which is formed in the first semiconductor layer (amorphous Si film 122) is formed larger than the portion of the data line 24 which is formed in the second semiconductor layer (n+amorphous Si film 123). In the method for manufacturing the active matrix substrate 10, in the source layer formation step, a portion of the first semiconductor part which is formed in the first semiconductor layer is formed larger than the portion of the first semiconductor part which is formed in the second semiconductor layer. In such a manner, the portion of the data line 24 which is formed in the first semiconductor layer is formed larger than the portion of the data line 24 which is formed in the second semiconductor layer, to thereby form the data line having a stepwise shape with a larger number of steps. It is thus possible to achieve higher coverage properties of the protective insulating film formed on the data line 24, and higher yield of the active matrix substrate 10 having the common electrode 30.

A pattern for forming the second semiconductor part which is included in a photomask used in the source layer formation step is larger than a pattern for forming the main conductor part 133 which is included in a photomask used in the pixel electrode layer formation step. In such a manner, a difference in size of a pattern of a photomask to be used is set between the source layer formation step and the pixel electrode layer formation step, and hence the portion of the data line 24 which is formed in the first semiconductor layer can be formed larger than the portion of the data line 24 which is formed in the second semiconductor layer.

In the active matrix substrate 10, the protective insulating film includes a lower layer insulating film (lower SiNx film 151) and an upper layer insulating film (upper SiNx film 152) which are formed by using an identical material under different conditions. In the method for manufacturing the active matrix substrate 10, the step of forming the protective insulating film includes processing of forming a lower layer insulating film and an upper layer insulating film by using an identical material under different conditions. In such a manner, two-layered protective insulating films are formed by using the identical material (SiNx), and hence two-layered protective insulating films capable of insulating between the pixel electrode layer and the common electrode layer can be easily formed even when there is a conductive foreign material on the substrate before forming the protective insulating film.

In the active matrix substrate 10, a compressive stress is generated in one of the lower layer insulating film and the upper layer insulating film, and a tensile stress is generated in the other. In the method for manufacturing the active matrix substrate 10, in the processing of forming the lower layer insulating film and the upper layer insulating film, the lower layer insulating film and the upper layer insulating film are formed such that a compressive stress is generated in one film and a tensile stress is generated in the other film. In such a manner, there are formed two-layered protective insulating films in which stresses in opposite directions to each other are generated, to thereby enable cancelling of the stresses generated in the respective layers of the protective insulating film. It is thus possible to achieve high coverage properties of the protective insulating film, and high yield of the active matrix substrate 10 having the common electrode 30.

In the active matrix substrate 10, a thickness of the lower layer insulating film is 150 to 350 nm, and a thickness of the upper layer insulating film is 400 to 600 nm. In the method for manufacturing the active matrix substrate 10, in the processing of forming the lower layer insulating film and the upper layer insulating film, a lower layer insulating film with a thickness of 150 to 350 nm and an upper layer insulating film with a thickness of 400 to 600 nm are formed. Accordingly, the stresses generated in the respective layers of the protective insulating films can be cancelled, and a leakage occurrence ratio of the data line 24 and the common electrode 30 can be suppressed. It is thus possible to achieve high coverage properties of the protective insulating film, and high yield of the active matrix substrate 10 having the common electrode 30.

In the active matrix substrate 10, the portion of the data line 24 which is formed in the second wiring layer, the source electrode 143, and the drain electrode 144 are formed of molybdenum or a material containing molybdenum (e.g., an alloy of molybdenum and niobium). In the method for manufacturing the active matrix substrate 10, in the source layer formation step, the first and second conductor parts are formed of molybdenum or a material containing molybdenum. Hence, it is possible to prevent occurrence of a generated foreign material and achieve high yield of the active matrix substrate 10 having the common electrode 30.

Although the active matrix substrate 10 described above has the first to fourth features, an active matrix substrate having only the first feature of the first to fourth features, or an active matrix substrate having the first feature and one or two of the second to fourth features, may be configured as modified examples of the present embodiment. Each of the active matrix substrates 10 according to these modified examples can be manufactured by a manufacturing method obtained by excluding the features on the process for realizing the second to fourth features from the foregoing method for manufacturing the active matrix substrate 10.

Although the description has been given of the case of applying the present invention to the active matrix substrate in the liquid crystal panel of the lateral electric field system, the present invention can also be applied to an active matrix substrate in the liquid crystal panel of the vertical electric field system.

INDUSTRIAL APPLICABILITY

An active matrix substrate of the present invention has a feature that has a common electrode and has high yield, and can thus be used for a liquid crystal panel and the like.

DESCRIPTION OF REFERENCE CHARACTERS

1: LIQUID CRYSTAL DISPLAY DEVICE
2: LIQUID CRYSTAL PANEL
3: DISPLAY CONTROL CIRCUIT
4: GATE LINE DRIVE CIRCUIT
5: DATA LINE DRIVE CIRCUIT
6: BACKLIGHT
10: ACTIVE MATRIX SUBSTRATE
20: PIXEL CIRCUIT
21: TFT
22: PIXEL ELECTRODE
23: GATE LINE
24: DATA LINE
30: COMMON ELECTRODE
40: COUNTER SUBSTRATE
111: GATE ELECTRODE
121, 151, 152: SiNx FILM
122: AMORPHOUS Si FILM
123: n+AMORPHOUS Si FILM
133, 135: MAIN CONDUCTOR PART
134: CONDUCTOR PART
141: IZO FILM
143: SOURCE ELECTRODE
144: DRAIN ELECTRODE

The invention claimed is:

1. An active matrix substrate, comprising:
a plurality of gate lines formed in a first wiring layer;
a plurality of data lines, each of which is a laminated wiring formed in a first semiconductor layer, a second semiconductor layer, a second wiring layer, and a pixel electrode layer;
a plurality of pixel circuits arranged corresponding to intersections of the gate lines and the data lines and each including a switching element and a pixel electrode;
a protective insulating film formed in a layer over the gate line, the data line, the switching element, and the pixel electrode; and
a common electrode formed in a layer over the protective insulating film, wherein
the switching element includes
a gate electrode formed in the first wiring layer,
a source electrode and a drain electrode formed in the second wiring layer,
a channel region formed in the first semiconductor layer,
a semiconductor part formed in the second semiconductor layer and under the source electrode and the drain electrode, and
a conductor part formed in the pixel electrode layer and on the source electrode and the drain electrode, and
a portion of the data line which is formed in the second semiconductor layer is formed larger than portions of the data line which are formed in the second wiring layer and the pixel electrode layer, and the semiconductor part is formed larger than the source electrode, the drain electrode, and the conductor part.

2. The active matrix substrate according to claim 1, wherein a portion of the data line which is formed in the first semiconductor layer is formed larger than the portion of the data line which is formed in the second semiconductor layer.

3. The active matrix substrate according to claim 1, wherein the protective insulating film includes a lower layer insulating film and an upper layer insulating film which are formed by using an identical material under different conditions.

4. The active matrix substrate according to claim 3, wherein a compressive stress is generated in one of the lower layer insulating film and the upper layer insulating film, and a tensile stress is generated in the other.

5. The active matrix substrate according to claim 3, wherein a thickness of the lower layer insulating film is 150 to 350 nm, and a thickness of the upper layer insulating film is 400 to 600 nm.

6. The active matrix substrate according to claim 1, wherein the portion of the data line which is formed in the second wiring layer, the source electrode, and the drain electrode are formed of molybdenum or a material containing molybdenum.

7. The active matrix substrate according to claim 6, wherein the portion of the data line which is formed in the second wiring layer, the source electrode, and the drain electrode are formed of an alloy of molybdenum and niobium.

8. A method for manufacturing an active matrix substrate, comprising:
a step of forming a plurality of gate lines and gate electrodes of a plurality of switching elements in a first wiring layer;
a step of forming a gate insulating film, forming a first semiconductor film in a first semiconductor layer, and forming a second semiconductor film in a second semiconductor layer;
a source layer formation step of forming, in a second wiring layer, a first conductor part to be a base of a main conductor part of a plurality of data lines, and a second conductor part to be a base of a source electrode and a drain electrode of the switching element, while patterning the first and second semiconductor films to form a second semiconductor part to be a base of a first semiconductor part located under the main conductor part, a channel region of the switching element which is located in the first semiconductor layer, and a third semiconductor part to be a base of a semiconductor part located under the source electrode and the drain electrode in the second semiconductor layer;
a pixel electrode layer formation step of forming, in a pixel electrode layer, a pixel electrode, a third conductor part located on the main conductor part, and a conductor part located on the source electrode and the drain electrode, while patterning the first and second conductor parts, a portion of the second semiconductor part which is formed in the second semiconductor layer, and the third semiconductor part, to form the main conductor part, the source electrode, the drain electrode, the first semiconductor part, and the semiconductor part;
a step of forming a protective insulating film in a layer over the pixel electrode, and
a step of forming a common electrode in a layer over the protective insulating film, wherein in the pixel electrode layer formation step, a portion of the first semiconductor part which is formed in the second semiconductor layer is formed larger than the main conductor part and the third conductor part, and the semiconductor part is formed larger than the source electrode, the drain electrode, and the conductor part.

9. The method for manufacturing an active matrix substrate according to claim 8, wherein in the source layer formation step, a portion of the first semiconductor part which is formed in the first semiconductor layer is formed larger than the portion of the first semiconductor part which is formed in the second semiconductor layer.

10. The method for manufacturing an active matrix substrate according to claim 8, wherein
the pixel electrode layer formation step includes film formation processing, photoresist formation processing, etching processing, and photoresist peeling processing, and
in the etching processing, using a photoresist formed in the photoresist formation processing as a mask, wet etching is performed on a film obtained in the film formation processing, and the first and second conductor parts, and dry etching is performed on the portion of the second semiconductor part which is formed in the second semiconductor layer, and the third semiconductor part.

11. The method for manufacturing an active matrix substrate according to claim 9, wherein a pattern for forming the second semiconductor part which is included in a photomask used in the source layer formation step is larger than a pattern for forming the main conductor part which is included in a photomask used in the pixel electrode layer formation step.

12. The method for manufacturing an active matrix substrate according to claim 8, wherein the step of forming the protective insulating film includes processing of forming a lower layer insulating film and an upper layer insulating film by using an identical material under different conditions.

13. The method for manufacturing an active matrix substrate according to claim 12, wherein in the processing of forming the lower layer insulating film and the upper layer insulating film, the lower layer insulating film and the upper layer insulating film are formed such that a compressive stress is generated in one film and a tensile stress is generated in the other film.

14. The method for manufacturing an active matrix substrate according to claim 12, wherein in the processing of forming the lower layer insulating film and the upper layer insulating film, a lower layer insulating film with a thickness of 150 to 350 nm and an upper layer insulating film with a thickness of 400 to 600 nm are formed.

15. The method for manufacturing an active matrix substrate according to claim 8, wherein in the source layer formation step, the first and second conductor parts are formed of molybdenum or a material containing molybdenum.

16. The method for manufacturing an active matrix substrate according to claim 15, wherein in the source layer formation step, the first and second conductor parts are formed of an alloy of molybdenum and niobium.

* * * * *